(12) United States Patent
Buckey et al.

(10) Patent No.: US 8,988,841 B2
(45) Date of Patent: Mar. 24, 2015

(54) APPARATUS AND METHODS FOR INPUT PROTECTION FOR POWER CONVERTERS

(75) Inventors: James Buckey, Lower Burrell, PA (US); Ralph Flaugher, Allison Park, PA (US); Shelby Chun, Mt. Lebanon, PA (US); Narendranath Nagarur, Pittsburgh, PA (US)

(73) Assignee: Siemens Aktiengesellschaft, München (DE)

( * ) Notice: Subject to any disclaimer, the term of this patent is extended or adjusted under 35 U.S.C. 154(b) by 88 days.

(21) Appl. No.: 13/605,316

(22) Filed: Sep. 6, 2012

(65) Prior Publication Data

US 2014/0063876 A1  Mar. 6, 2014

(51) Int. Cl.
*H02H 3/24* (2006.01)
*G01R 31/02* (2006.01)
*G01R 31/327* (2006.01)
*H02M 1/32* (2007.01)

(52) U.S. Cl.
CPC ............... *G01R 31/327* (2013.01); *H02M 1/32* (2013.01)
USPC .......................................... 361/92; 324/424

(58) Field of Classification Search
USPC .......................................... 361/92; 324/424
See application file for complete search history.

(56) References Cited

U.S. PATENT DOCUMENTS

| 6,262,871 B1 * | 7/2001 | Nemir et al. ..................... 361/42 |
| 7,944,068 B2 * | 5/2011 | Wagoner et al. ................. 290/44 |
| 2009/0119036 A1 * | 5/2009 | Jayanth et al. .................. 702/60 |
| 2009/0128347 A1 * | 5/2009 | Bucella et al. ................. 340/654 |
| 2012/0161681 A1 | 6/2012 | Kuroda |

FOREIGN PATENT DOCUMENTS

| EP | 1933449 A1 | 6/2008 |
| EP | 2328268 A1 | 6/2011 |

OTHER PUBLICATIONS

PCT International Search Report mailed Apr. 7, 2014 corresponding to PCT International Application No. PCT/US2013/056575 filed Aug. 26, 2013 (11 pages).

* cited by examiner

*Primary Examiner* — Scott Bauer

(57) ABSTRACT

Systems and methods in accordance with this invention provide a power converter including an input signal terminal, a first output signal at a first output signal terminal, and a controller. The controller is adapted to switch the first output signal from a first value to a second value, measure a voltage at the input signal terminal as a function of time, set a flag to a first flag value if the measured voltage falls below a predetermined value within a first predetermined time interval after the first output signal has been switched from the first value to the second value, otherwise set the flag to a second flag value, and save the flag in a memory. Numerous other aspects are also provided.

22 Claims, 3 Drawing Sheets

APPARATUS AND METHODS FOR INPUT PROTECTION FOR POWER CONVERTERS

BACKGROUND

This invention relates to power converters. More particularly, this invention relates to apparatus and methods for input protection for power converters, such as DC-DC converters, AC-DC converters, DC-AC inverters, variable frequency drives, and other similar power converters.

SUMMARY

In a first aspect of the invention, a power converter is provided including an input signal terminal, a first output signal at a first output signal terminal, and a controller. The controller is adapted to: (a) switch the first output signal from a first value to a second value, (b) measure a voltage at the input signal terminal as a function of time, (c) set a flag to a first flag value if the measured voltage falls below a predetermined value within a first predetermined time interval after the first output signal has been switched from the first value to the second value, (d) set the flag to a second flag value if the measured voltage does not fall below a predetermined value within the first predetermined time interval after the first output signal has been switched from the first value to the second value, and (e) save the flag in a memory.

In a second aspect of the invention, a method of operating a power converter is provided, the power converter including an input signal terminal, a first output signal terminal and a second output signal terminal. The method includes: (a) providing a first output signal at the first output signal terminal, (b) switching the first output signal from a first value to a second value, measuring a voltage at the input signal terminal as a function of time, (c) setting a flag to a first flag value if the measured voltage falls below a predetermined value within a first predetermined time interval after the first output signal has been switched from the first value to the second value, (d) setting the flag to a second flag value if the measured voltage does not fall below the predetermined value within the first predetermined time interval after the first output signal has been switched from the first value to the second value, and (e) saving the flag in a memory.

Other features and aspects of the present invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout, and in which.

DETAILED DESCRIPTION

Figure 1:
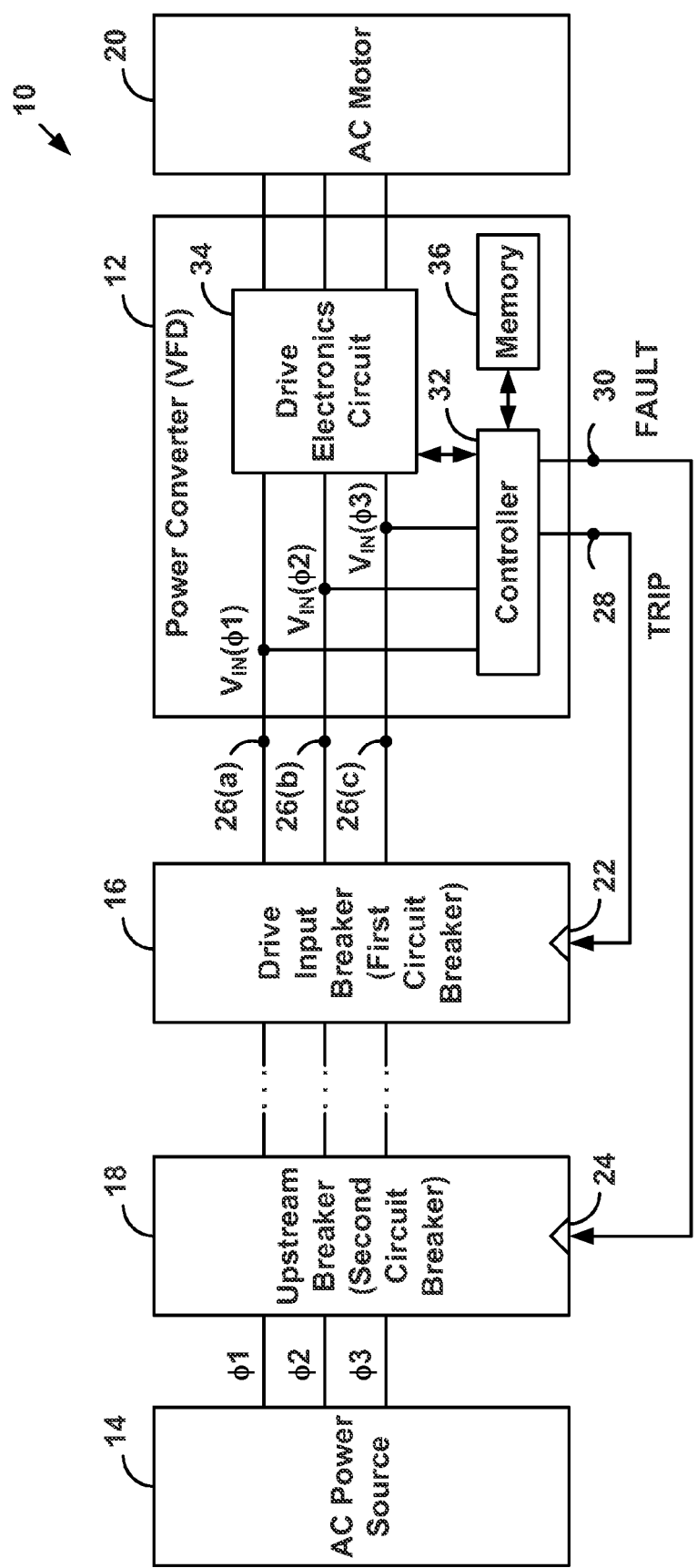
FIG. 1 is a block diagram of a system including an example embodiment of a power converter in accordance with this invention.

A power converter, such as a DC-DC converter, AC-DC converter, DC-AC inverter, variable frequency drive ("VFD"), or other similar power converter, is typically installed with an input protection device (e.g., a circuit breaker) designed to interrupt or disconnect power from the power converter under certain conditions (e.g., a short circuit, an overcurrent, etc.). Some input protection devices include a control input that may be coupled to an electrical control signal to open the input protection device and disconnect power from the protected circuit even if a short circuit or overcurrent condition has not occurred.

Thus, some power converters provide a control signal output that is specified to be connected to the control input of an input protection device, and that may be triggered in the event of a predetermined condition in the power converter. For example, in a VFD, the predetermined condition may be a catastrophic internal failure, such as excessive power losses in the VFD, excessive level of reactive input current to the VFD, arcing within the VFD, etc.

Unfortunately, some installers may not properly install a protection device with the VFD. For example, an inexperienced installer may not install any input protection device, may install an incorrect type of input protection device that does not include a control input, or may not connect the control signal output of the VFD to the control input of the input protection device.

Further, even if the input protection device is initially installed correctly, as a result of subsequent tampering, the control signal output of the VFD may become disconnected from the control input of the input protection device. In such circumstances, the VFD is unable to control the input protection device, and thus is unable to disconnect the VFD from the power source.

To overcome these problems, systems and methods in accordance with this invention provide a VFD that includes an input protection test function and a drive fault function. The input protection test function, which may be initiated at any time by a user, performs a test to open the input protection device to disconnect power from the VFD. A Drive Run Inhibit ("DRI") flag is set based on the test results (e.g., pass=FALSE, and fail=TRUE), and is saved in non-volatile memory. The VFD is permitted to run only if the saved DRI flag value is FALSE, and is not permitted to run if the saved DRI flag value is TRUE. In this regard, the VFD may operate only if the VFD is able to open the input protection device to disconnect power to the VFD.

The drive fault function may be initiated on the occurrence of a predetermined condition in the VFD (e.g., a catastrophic internal failure in the VFD, such as excessive power losses, excessive level of reactive input current, internal arcing, or some other condition). The drive fault function also performs the test described above to open the input protection device to disconnect power from the VFD, and also stores the DRI flag in memory. In addition, if the test fails, the VFD may open an upstream input protection device to disconnect power to the VFD.

For simplicity, the remaining text will describe the invented methods and apparatus using a VFD power converter. Persons of ordinary skill in the art will understand, however, that the invented methods and apparatus may be used with other power converters, such as DC-DC converters, AC-DC converters, DC-AC inverters, or other similar power converter.

Referring now to FIG. 1, an example system that includes a VFD in accordance with this invention is described. In particular, system 10 includes a VFD 12, an AC power source 14, a first circuit breaker 16, a second circuit breaker 18 and an AC motor 20. Persons of ordinary skill in the art will understand that system 10 may include components other than or in addition to the components illustrated in FIG. 1.

AC power source 14 may be an electric utility, a generator, or other similar source of AC power. In the illustrated embodiment, AC power source 14 provides three phase (ϕ1-ϕ3) power. Persons of ordinary skill in the art will understand that AC power source 14 alternatively may provide one, two, or more than three phase power.

First circuit breaker 16 and second circuit breaker 18 each may include a trip mechanism that opens electrical contacts (not shown) in response to an overcurrent or short-circuit fault to stop the flow of current to VFD 12 and AC motor 20. In addition, first circuit breaker 16 includes a control input terminal 22 adapted to cause the trip mechanism to open the electrical contacts in first circuit breaker 16 when an electrical signal at control input terminal 22 switches from a first value (e.g., 0V or "OFF") to a second value (e.g., 5V or "ON"). Likewise, second circuit breaker 18 includes a control input terminal 24 adapted to cause the trip mechanism to open the electrical contacts in second circuit breaker 18 when an electrical signal at control input terminal 24 switches from the first value to the second value.

For example, first circuit breaker 16 and second circuit breaker 18 each may be a Type GMSG vacuum circuit breaker by Siemens Industry, Inc., Wendell, N.C. Persons of ordinary skill in the art will understand that other circuit breakers may be used, and that first circuit breaker 16 and second circuit breaker 18 may both be the same type of circuit breaker, or may be different types of circuit breakers. In addition, persons of ordinary skill in the art will understand that first circuit breaker 16 and/or second circuit breaker 18 alternatively may be a contactor used to switch power ON and OFF to VFD 12.

First circuit breaker 16 is typically located near VFD 12, and may commonly be referred to as a "drive input breaker." Accordingly, first circuit breaker 16 will also be referred to herein as drive input breaker 16. Persons of ordinary skill in the art will understand that first circuit breaker 16 may be separate from VFD 12 (as shown in FIG. 1), or may be included as part of VFD 12.

Second circuit breaker 18 is typically located "upstream" from drive input breaker 16 and VFD 12, and may commonly be referred to as an "upstream breaker." Accordingly, second circuit breaker 18 will also be referred to herein as upstream breaker 18. Second circuit 18 typically may provide protection to multiple circuits in addition to the circuit including drive input breaker 16 and VFD 12.

VFD 12 includes input terminals 26(a)-26(c) coupled to output terminals of drive first circuit breaker 16, a first output terminal 28 providing an output signal TRIP coupled to control input terminal 22 of first circuit breaker 16, and a second output terminal 30 providing an output signal FAULT coupled to control input terminal 24 of second circuit breaker 18. In addition, VFD 12 includes a controller 32, a drive electronics circuit 34 and a memory 36. Controller 32 is coupled to input terminals 26(a)-26(c), first output terminal 28, second output terminal 30, drive electronics circuit 34 and memory 36. Persons of ordinary skill in the art will understand that VFD 12 may include components other than or in addition to the components illustrated in FIG. 1.

Controller 32 may be a microprocessor controller, a programmable logic controller, a mainframe computer, a personal computer, a handheld computer, or other similar processor that may be used to control the operation of drive electronics circuit 34. Drive electronics circuit 34 may include conventional VFD electronics circuits that convert an AC input signal at input terminals 26(a)-26(c) to an AC output signal coupled to AC motor 20. Memory 36 may be a non-volatile memory, such as a magnetic disc memory, an optical disc memory, a hard drive, a floppy disc, a flash memory, or other similar memory.

In accordance with this invention, controller 32 includes an input protection test process and a drive fault process. The input protection test process, which may be initiated at any time by a user of VFD 12, performs a test to open first circuit breaker 16 to disconnect power from VFD 12. If the test is successful, controller 32 sets a DRI flag value to FALSE. If, however, the test is unsuccessful, controller 32 sets the DRI flag value to TRUE. The DRI flag is stored in memory 36. VFD 12 is permitted to run if DRI=FALSE, indicating that VFD 12 is able to open first circuit breaker 16. IF DRI=TRUE, controller 32 will not permit VFD 12 to run.

The drive fault process may be initiated by controller 32 on the occurrence of a predetermined condition (e.g., a catastrophic internal failure, such as excessive power losses in VFD 12, excessive level of reactive input current to VFD 12, arcing within the VFD, or some other condition) to open drive input breaker 16 to disconnect power from VFD 12. The drive fault process also performs the test process described above to open first circuit breaker 16 to disconnect power from VFD 12, and also stores the DRI flag in memory 36. In addition, as described in more detail below, if the test is unsuccessful, controller 32 may open second circuit breaker 18 to disconnect power from first circuit breaker 16 and VFD 12.

Figure 2:
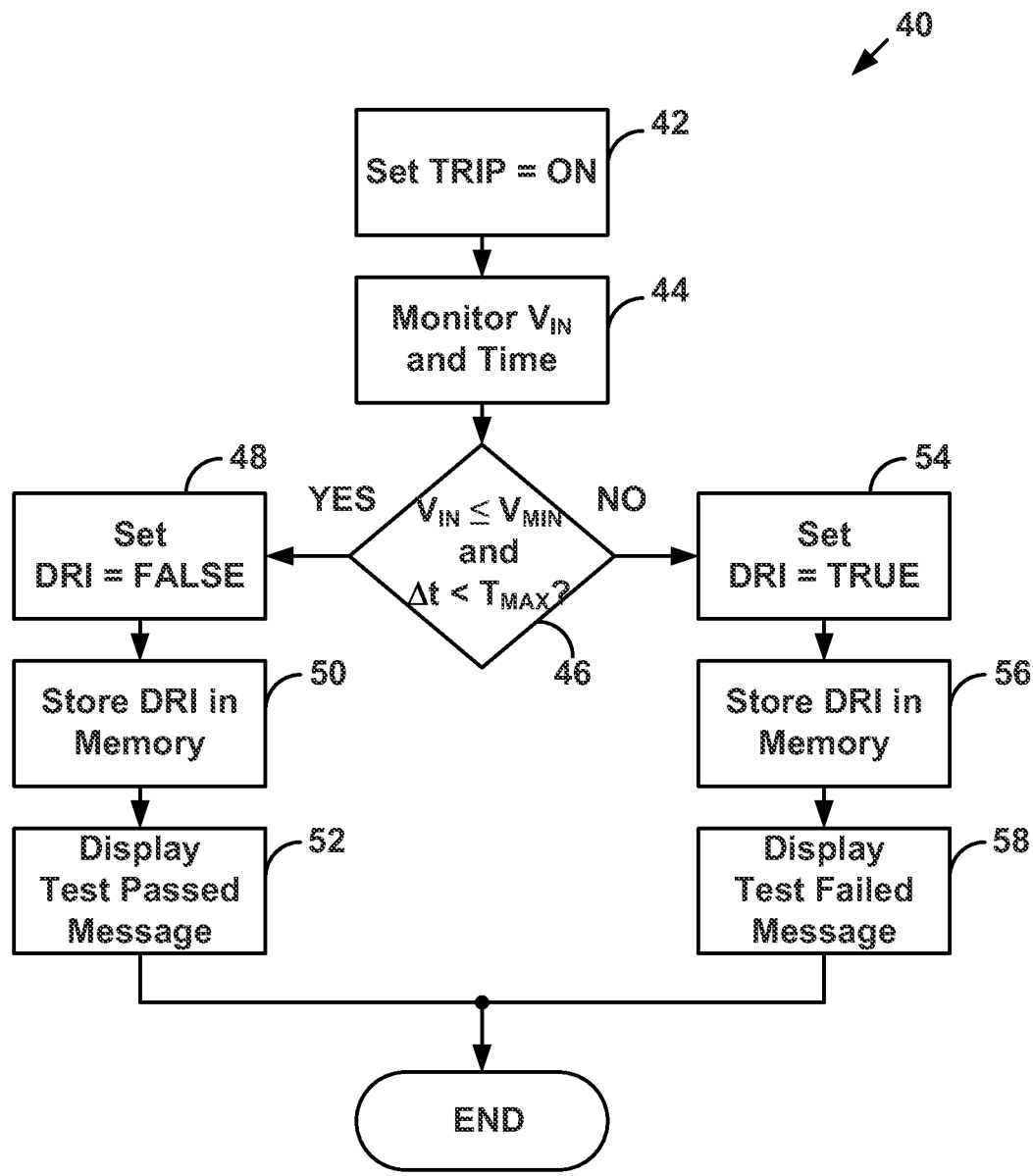
FIG. 2 is a flow diagram of an example test process in accordance with this invention.

Referring now to FIGS. 1 and 2, an example test process 40 in accordance with this invention is described. Test process 40 may be initiated by a user by issuing a test command to controller 32, such as via a hardware and/or a software switch, or by other similar method. At step 42, in response to the test command, controller 32 switches TRIP signal at first output terminal 28 from a first value, such as OFF (e.g., 0V) to a second value, such as ON (e.g., 5V). The TRIP signal is coupled to control terminal 22 of first circuit breaker 16, and thus when TRIP signal switches from OFF to ON, first circuit breaker 16 should open to disconnect power from VFD 16.

To determine if first circuit breaker 16 has opened, at step 44, controller 32 monitors input voltages $V_{IN}(\phi1)$, $V_{IN}(\phi2)$ and $V_{IN}(\phi3)$ at input terminals 26(a), 26(b) and 26(c), respectively, as a function of time. If TRIP signal is properly connected to control terminal 22 of first circuit breaker 16, and if first circuit breaker 16 is properly functioning, input voltages $V_{IN}(\phi1)$, $V_{IN}(\phi2)$ and $V_{IN}(\phi3)$ each should decrease to 0V within a relatively short time interval after TRIP signal has been switched from OFF to ON.

Thus, at step 46, controller 32 determines if input voltages $V_{IN}(\phi1)$, $V_{IN}(\phi2)$ and $V_{IN}(\phi3)$ each are less than or equal to a predetermined value $V_{MIN}$ within a first predetermined time interval $T_{MAX}$ after TRIP signal has been switched from OFF to ON. Predetermined value $V_{MIN}$ may be between about 15V and about 0V, or some other value that may be used to determine that first circuit breaker 16 has disconnected power from VFD 12. First predetermined time interval $T_{MAX}$ may be between about 1 second and about 1 microsecond, or some other time interval for first circuit breaker 16 to disconnect power from VFD 12 after TRIP signal has been switched from OFF to ON.

If input voltages $V_{IN}(\phi1)$, $V_{IN}(\phi2)$ and $V_{IN}(\phi3)$ are each less than or equal to predetermined value $V_{MIN}$ within first predetermined time interval $T_{MAX}$ after TRIP signal has been switched from OFF to ON, the process proceeds to step 48, and controller 32 sets the DRI flag value to FALSE. At step 50, controller 32 stores the DRI flag in memory 36. At step 52, controller 32 optionally may display a message to the user indicating that the test has passed. Process 40 then ends with input voltages $V_{IN}(\phi1)$, $V_{IN}(\phi2)$ and $V_{IN}(\phi3)$ each less than or equal to predetermined value $V_{MIN}$, and with DRI=FALSE saved in memory 36. As a result, controller 32 does not prevent VFD 12 from running based on the input protection test results.

Referring again to step 46, if controller 32 determines that one or more of input voltages $V_{IN}(\phi 1)$, $V_{IN}(\phi 2)$ and $V_{IN}(\phi 3)$ are not less than or equal to predetermined value $V_{MIN}$ within first predetermined time interval $T_{MAX}$ after TRIP signal has been switched from OFF to ON, the process proceeds to step 54, and controller 32 sets the DRI flag value to TRUE. At step 50, controller 32 stores the DRI flag in memory 36. At step 56, controller 32 optionally may display a message to the user indicating that the test has failed. Process 40 then ends with DRI=TRUE saved in memory 36. As a result, controller 32 prevents VFD 12 from running based on the input protection test results.

In example process 40 described above, controller 32 monitors each of input voltages $V_{IN}(\phi 1)$, $V_{IN}(\phi 2)$ and $V_{IN}(\phi 3)$ to determine if all three input voltage are less than or equal to predetermined value $V_{MIN}$ within first predetermined time interval $T_{MAX}$ after TRIP signal has been switched from OFF to ON. Persons of ordinary skill in the art will understand that controller 32 alternatively may monitor fewer than all input voltages $V_{IN}(\phi 1)$, $V_{IN}(\phi 2)$ and $V_{IN}(\phi 3)$.

For example, at step 44, controller 32 may monitor input voltage $V_{IN}(\phi 2)$ and at step 46, controller 32 alternatively may determine if input voltage $V_{IN}(\phi 2)$ is less than or equal to predetermined value $V_{MIN}$ within first predetermined time interval $T_{MAX}$ after TRIP signal has been switched from OFF to ON, and may set the DRI flag value accordingly. Other alternatives also may be used.

Figure 3:
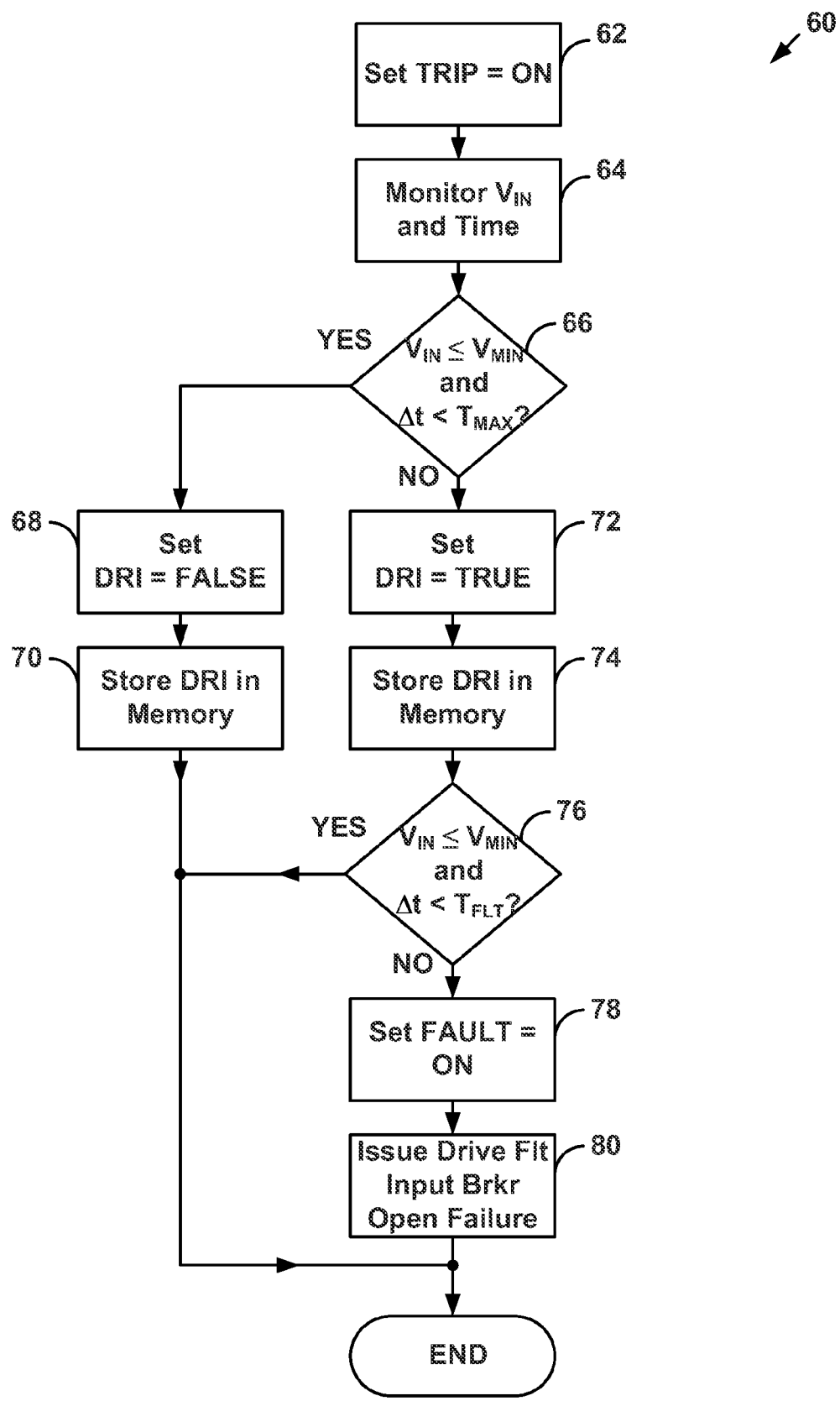
FIG. 3 is a flow diagram of an example drive fault process in accordance with this invention.

Referring now to FIGS. 1 and 3, an example drive fault process 60 in accordance with this invention is described. Drive fault process 60 may be initiated by controller 32 on the occurrence of a predetermined condition (e.g., a catastrophic internal failure, such as excessive power losses in VFD 12, excessive level of reactive input current to VFD 12, arcing within VFD 12, or some other condition).

At step 62, in response to the drive fault command, controller 32 switches TRIP signal at first output terminal 28 from a first value, such as OFF (e.g., 0V) to a second value, such as ON (e.g., 5V). When the TRIP signal switches from OFF to ON, first circuit breaker 16 should open to disconnect power from VFD 16.

To determine if first circuit breaker 16 has opened, at step 64, controller 32 monitors input voltages $V_{IN}(\phi 1)$, $V_{IN}(\phi 2)$ and $V_{IN}(\phi 3)$ at input terminals 26(a), 26(b) and 26(c), respectively, as a function of time. If TRIP signal is properly connected to control terminal 22 of first circuit breaker 16, and if first circuit breaker 16 is properly functioning, input voltages $V_{IN}(\phi 1)$, $V_{IN}(\phi 2)$ and $V_{IN}(\phi 3)$ each should decrease to 0V within a relatively short time period after TRIP signal has been switched from OFF to ON.

Thus, at step 66, controller 32 determines if input voltages $V_{IN}(\phi 1)$, $V_{IN}(\phi 2)$ and $V_{IN}(\phi 3)$ each are less than or equal to predetermined value $V_{MIN}$ within first predetermined time interval $T_{MAX}$ after TRIP signal has been switched from OFF to ON. If input voltages $V_{IN}(\phi 1)$, $V_{IN}(\phi 2)$ and $V_{IN}(\phi 3)$ are each less than or equal to predetermined value $V_{MIN}$ within first predetermined time interval $T_{MAX}$ after TRIP signal has been switched from OFF to ON, the process proceeds to step 68, and controller 32 sets the DRI flag value to FALSE. At step 70, controller 32 stores the DRI flag in memory 36. Process 60 then ends with input voltages $V_{IN}(\phi 1)$, $V_{IN}(\phi 2)$ and $V_{IN}(\phi 3)$ each less than or equal to predetermined value $V_{MIN}$, and with DRI=FALSE saved in memory 36.

Referring again to step 66, if controller 32 determines that one or more of input voltages $V_{IN}(\phi 1)$, $V_{IN}(\phi 2)$ and $V_{IN}(\phi 3)$ are not less than or equal to predetermined value $V_{MIN}$ within first predetermined time interval $T_{MAX}$ after TRIP signal has been switched from OFF to ON, the process proceeds to step 72, and controller 32 sets the DRI flag value to TRUE. At step 74, controller 32 stores the DRI flag in memory 36.

In some instances, drive input breaker 16 may not be able to disconnect power to VFD 12 within $T_{MAX}$, but may be able to do so within a longer time interval. Accordingly, at step 76, controller 32 continues to monitor input voltages $V_{IN}(\phi 1)$, $V_{IN}(\phi 2)$ and $V_{IN}(\phi 3)$ at input terminals 26(a), 26(b) and 26(c), respectively, as a function of time, and determines if input voltages $V_{IN}(\phi 1)$, $V_{IN}(\phi 2)$ and $V_{IN}(\phi 3)$ each are less than or equal to predetermined value $V_{MIN}$ within a second predetermined time $T_{FLT}$ after TRIP signal has been switched from OFF to ON. Second predetermined time interval $T_{FLT}$ may be between about 1 second and about 5 seconds, or some other time interval longer than $T_{MAX}$. If so, process 60 ends with input voltages $V_{IN}(\phi 1)$, $V_{IN}(\phi 2)$ and $V_{IN}(\phi 3)$ each less than or equal to predetermined value $V_{MIN}$, and with DRI=TRUE saved in memory 36.

If, however, at step 76, controller 32 determines that one or more of input voltages $V_{IN}(\phi 1)$, $V_{IN}(\phi 2)$ and $V_{IN}(\phi 3)$ are not less than or equal to predetermined value $V_{MIN}$ within second predetermined time interval $T_{FLT}$ after TRIP signal has been switched from OFF to ON, the process proceeds to step 78, and controller 32 switches the FAULT signal at second output terminal 30 from a first value, such as OFF (e.g., 0V) to a second value, such as ON (e.g., 5V), which causes second circuit breaker 18 to open to disconnect power to first circuit breaker 16 and VFD 12.

In this regard, if first circuit breaker 16 is unable to disconnect power to VFD 12 under the longer time interval $T_{FLT}$, this may indicate a serious safety problem. As a result, controller 32 opens second circuit breaker 18 to prevent serious damage or injury. In addition, at step 80, controller 32 issues a Drive Fault Input Breaker Open Failure warning to indicate the nature of the fault. Process 60 then ends with DRI=TRUE saved in memory 36.

In example process 60 described above, controller 32 monitors each of input voltages $V_{IN}(\phi 1)$, $V_{IN}(\phi 2)$ and $V_{IN}(\phi 3)$, and determines if each input voltage is less than or equal to predetermined value $V_{MIN}$ within first predetermined time interval $T_{MAX}$ after TRIP signal has been switched from OFF to ON. Persons of ordinary skill in the art will understand that drive fault functions in accordance with this invention alternatively may monitor fewer than all input voltages $V_{IN}(\phi 1)$, $V_{IN}(\phi 2)$ and $V_{IN}(\phi 3)$. For example, at step 64, controller 32 alternatively may monitor input voltages $V_{IN}(\phi 1)$ and $V_{IN}(\phi 3)$, and at step 66, controller 32 alternatively may determine if each of input voltages $V_{IN}(\phi 1)$ and $V_{IN}(\phi 3)$ is less than or equal to predetermined value $V_{MIN}$ within first predetermined time interval $T_{MAX}$ after TRIP signal has been switched from OFF to ON, and may set the DRI flag value accordingly. The same alternative example applies to step 76. Other alternatives also may be used.

The foregoing merely illustrates the principles of this invention, and various modifications can be made by persons of ordinary skill in the art without departing from the scope and spirit of this invention.

The invention claimed is:
1. A power converter comprising:
an input signal terminal;
a first output signal at a first output signal terminal;

a first circuit breaker having an output terminal coupled to the input signal terminal and a control input terminal coupled to the first output signal terminal; and a controller including an input protection test process performing an input protection test, wherein, for the input protection test process, the controller is adapted to:

switch the first output signal from a first value to a second value;

measure a voltage at the input signal terminal as a function of time;

set a flag to a first flag value if the measured voltage falls below a predetermined value within a first predetermined time interval after the first output signal has been switched from the first value to the second value;

set the flag to a second flag value if the measured voltage does not fall below the predetermined value within the first predetermined time interval after the first output signal has been switched from the first value to the second value; and save the flag in a memory, display a message indicating that the input protection test has passed when the flag is set to the first flag value, and permit the power converter to run based on a passed input protection test, and display a message indicating that the input protection test has failed when the flag is set to the second flag value, and prevent the power converter from running based on a failed input protection test, wherein the controller further includes a drive fault function, the drive fault function performing the input protection test process and, when the input protection process test has failed, the controller is adapted to:

cause a second circuit breaker to open to disconnect power to the first circuit breaker and the power converter.

2. The power converter of claim 1, wherein:
the first circuit breaker is adapted to open when the first output signal switches from the first value to the second value.

3. The power converter of claim 1, wherein:
the first circuit breaker includes a breaker input terminal;
the breaker input terminal is coupled to a multi-phase input signal; and
the controller is adapted to measure a voltage at each phase of the input signal as a function of time.

4. The power converter of claim 3, wherein the controller is adapted to:
set the flag to the first value if the measured voltage of each phase of the multi-phase input signal falls below the predetermined value within the first predetermined time interval after the first output signal has been switched from the first value to the second value; and
set the flag to the second value if the measured voltage of any phase of the multi-phase input signal does not fall below the predetermined value within the first predetermined time interval after the first output signal has been switched from the first value to the second value.

5. The power converter of claim 1, wherein the predetermined value is between about 15V and about 0V.

6. The power converter of claim 1, wherein the first predetermined time interval is between about 1 second and about 1 microsecond.

7. The power converter of claim 1, wherein the controller switches the first output signal from the first value to the second value in response to either a test command or a drive fault.

8. The power converter of claim 1, further comprising a second output signal at a second output signal terminal, wherein the controller is further adapted to switch the second output signal from a first value to a second value if the measured voltage does not fall below the predetermined value within a second predetermined time interval after the first output signal has been switched from the first value to the second value.

9. The power converter of claim 8, wherein:
the first circuit breaker includes a breaker input terminal;
the breaker input terminal is coupled to an output terminal of the second circuit breaker;
the second output signal terminal of the power converter is coupled to a control input terminal of the second circuit breaker; and
the second circuit breaker is adapted to open when the second output signal switches from the first value to the second value.

10. The power converter of claim 8, wherein the second predetermined time interval is between about 1 second and about 5 seconds.

11. The power converter of claim 1, wherein the power converter comprises one or more of a DC-DC converter, an AC-DC converter, an DC-AC inverter, and a variable frequency drive ("VFD").

12. A method of operating a power converter comprising a first circuit breaker, an input signal terminal, a first output signal terminal and a second output signal terminal, the method comprising:

providing an output terminal of the first circuit breaker coupled to the input signal terminal and a control input terminal of the first circuit breaker coupled to the first output signal terminal;

providing a first output signal at the first output signal terminal;

switching the first output signal from a first value to a second value;

measuring a voltage at the input signal terminal as a function of time;

setting a flag to a first flag value if the measured voltage falls below a predetermined value within a first predetermined time interval after the first output signal has been switched from the first value to the second value;

setting the flag to a second flag value if the measured voltage does not fall below the predetermined value within the first predetermined time interval after the first output signal has been switched from the first value to the second value; and saving the flag in a memory, displaying a message indicating that an input protection test has passed when the flag is set to the first flag value, and permitting the power converter to run based on a passed input protection test, displaying a message indicating that the input protection test has failed when the flag is set to the second flag value, preventing the power converter from running based on a failed input protection test, and opening a second circuit breaker to disconnect power to the first circuit breaker and the power converter when the input protection test has failed.

13. The method of claim 12,
wherein the first circuit breaker is adapted to open when the first output signal switches from the first value to the second value.

14. The method of claim 12, further comprising coupling a breaker input terminal of the first circuit breaker to a multi-phase input signal, wherein measuring the voltage comprises measuring a voltage at each phase of the input signal as a function of time.

15. The method of claim 14, further comprising:
setting the flag to the first value if the measured voltage of each phase of the multi-phase input signal falls below the predetermined value within the first predetermined time interval after the first output signal has been switched from the first value to the second value; and
setting the flag to the second value if the measured voltage of any phase of the multi-phase input signal does not fall below the predetermined value within the first predetermined time interval after the first output signal has been switched from the first value to the second value.

16. The method of claim 12, wherein the predetermined value is between about 15V and about 0V.

17. The method of claim 12, wherein the first predetermined time interval is between about 1 second and about 1 microsecond.

18. The method of claim 12, further comprising switching the first output signal from the first value to the second value in response to either a test command or a drive fault.

19. The method of claim 12, further comprising:
providing a second output signal at the second output signal terminal; and
switching the second output signal from a first value to a second value if the measured voltage does not fall below the predetermined value within a second predetermined time interval after the first output signal has been switched from the first value to the second value.

20. The method of claim 19, further comprising:
coupling a breaker input terminal of the first circuit breaker to an output terminal of the second circuit breaker; and
coupling the second output signal terminal of the power converter to a control input terminal of the second circuit breaker,
wherein the second circuit breaker is adapted to open when the second output signal switches from the first value to the second value.

21. The method of claim 19, wherein the second predetermined time interval is between about 1 second and about 5 seconds.

22. The power converter of claim 12, wherein the power converter comprises one or more of a DC-DC converter, an AC-DC converter, an DC-AC inverter, and a variable frequency drive ("VFD").

* * * * *